United States Patent [19]
Mitra et al.

[11] Patent Number: 5,422,807
[45] Date of Patent: Jun. 6, 1995

[54] MICROCONTROLLER WITH IMPROVED A/D CONVERSION

[75] Inventors: Sumit Mitra, Tempe; Russ Cooper, Chandler, both of Ariz.; Martin Burghardt, Oberneuching, Germany

[73] Assignee: Microchip Technology Incorporated, Chandler, Ariz.

[21] Appl. No.: 938,907

[22] Filed: Aug. 31, 1992

[51] Int. Cl.[6] .............................................. G05B 9/02
[52] U.S. Cl. ................................... 364/184; 341/142; 327/544
[58] Field of Search ................. 364/184, 492; 341/118, 341/94, 126, 136, 165, 142, 144; 330/255; 128/680; 307/296.3, 465, 469, 296.3, 296 R, 443, 520; 363/17

[56] References Cited

U.S. PATENT DOCUMENTS

| | | | |
|---|---|---|---|
| 4,308,098 | 12/1981 | Neuner et al. | 341/118 |
| 4,972,189 | 11/1990 | Polito et al. | 341/118 |
| 4,992,676 | 2/1991 | Gerosa et al. | 307/443 |
| 5,023,614 | 6/1991 | Fung et al. | 341/144 |
| 5,045,717 | 9/1991 | Moen, Jr. et al. | 307/296.3 |
| 5,097,149 | 3/1992 | Lee | 307/443 |
| 5,178,152 | 1/1993 | Ozawa | 128/680 |
| 5,194,824 | 3/1993 | Wu et al. | 330/255 |
| 5,241,226 | 8/1993 | Rossi et al. | 307/520 |
| 5,268,597 | 12/1993 | Fong | 307/443 |
| 5,294,928 | 3/1994 | Cooper et al. | 341/142 |
| 5,305,191 | 4/1994 | Loftus, Jr. | 363/17 |

Primary Examiner—James P. Trammell
Attorney, Agent, or Firm—O'Connor Cavanagh

[57] ABSTRACT

A semiconductor microcontroller includes the capability to perform analog to digital conversions of an analog signal representative of a variable parameter indicative of the need to exercise a control function. While the analog to digital conversions are being performed, the microcontroller processor can be powered down to eliminate noise arising from switching activities of the processor as a source of inaccuracy in the conversion process. At the end of the conversion, the analog to digital converter can either shut itself down or wake up the processor. The powering down is achieved by simply disabling the clock input to the microcontroller so that the processor is still activated but incapable of undergoing switching functions.

17 Claims, 4 Drawing Sheets

MICROCONTROLLER WITH IMPROVED A/D CONVERSION

CROSS-REFERENCE TO RELATED APPLICATION

This application is related to a copending application Ser. No. 07/938,908 (the "'908 application") U.S. Pat. No. 5,294,928, of some of the same inventor/applicants herein, titled "A/D Converter with Zero Power Mode", filed on the same date as this application, assigned to the same assignee, and bearing Attorney's Docket No. MTI/083.

BACKGROUND OF THE INVENTION

The present invention relates generally to semiconductor microprocessors, to a class of microprocessors known as microcontrollers which perform a broad spectrum of control functions, and more particularly to CMOS semiconductor microcontrollers with on-chip analog to digital conversion capability.

The evolution of microprocessors into complex instruments and machines has led to sophisticated, fast real-time control capability. Large microprocessors of 16 or 32 bit capability with associated interrupt handler chips, programmable timer chips, ROM and RAM chips, have been replaced in many control function instances by single chip microcontrollers with all peripherals embedded on the same chip with the microcontroller. Operation of the chip in an expanded mode enhances the versatility of all on-chip features. Microcontrollers are used in a wide diversity of present-day applications, with new applications found almost daily. In hand-held instruments such as tiny pocket-sized pagers, the microcontroller is responsive to received characters to interpret them, produce an audible signal to notify the user of an incoming message (or not if the user prefers an inaudible mode), and produce multiple messages among the several last of those received on a suitable display, typically an LCD. The microcontroller can also recall from its internal memory any or all of the messages received in a given period of time. Among its other instrumentation uses are those as meters and testers, capable of carrying out thousands of tests, each in a millisecond or less.

Other applications include keyboard controllers for personal computers, in which the microcontroller serves to offload many tasks formerly handled by the processor, including continuous performance of numerous diagnostic procedures and notification to the processor if a problem is detected. Among other personal computer applications, microcontrollers are used in modems for command interpretation and data transmission, in printer buffers for high speed dumping of data in preparation for driving the printer at the appropriate speed, or for color plotters, in color copiers, electronic typewriters, cable television terminal equipment, lawn sprinkling controllers, credit card phone equipment, automotive applications such as engine control modules, antilock braking systems, automobile suspension control for desired designation of ride softness or rigidity according to user preference, and a host of other applications daily by industrial and consumer customers.

A real time microcontroller provides rapid solutions to signal processing algorithms and other numerically intensive computations, controls events such as opening and closing of relays, the position and speed of a motor, and other control functions such as those mentioned above. The central processing unit (CPU) of the microcontroller operates in conjunction with certain peripherals to perform the control function, including devices such as timers, signal ports, and baud rate generators, among others.

The present invention is part of an enhancement of an 8-bit user programmable reduced instruction set computer (RISC-type) microcontroller family manufactured and marketed by Microchip Technology Incorporated of Chandler, Ariz. (assignee of this application) as its PIC®16C5X family of CMOS (complementary metal-oxide-silicon) EPROM (electrically programmable read-only memory)—based microcontrollers. The enhanced user-programmable single chip device addresses the burgeoning number of embedded control applications requiring economical analog sensing and control applications. The device includes the capability to perform analog-to-digital (A/D) conversion.

Prior art microcontrollers that employ A/D conversion have an inherent problem of supply noise. The principal source of the supply noise problem is the digital switching circuitry. As the microcontroller executes instructions, sudden power dips occur because of the large amount of current being drawn during or at clock edges. It is these power dips or sudden drains of current which cause the supply voltage on power bus to "bounce" producing the noise which in turn affects the conversion result.

The effect on conversion result may be explained as follows. The A/D conversion is based on true voltage, that is, the taking of the voltage down to a certain predetermined bit resolution, on which the conversion process will be performed. If the reference voltage generated from the power supply is changed or changing as the microcontroller performs the conversion, then the conversion result will undergo a related change. The conversion is simply a ratio of the present value of the reference voltage. If that reference value is, say, five volts during a sampling by the sample and hold circuit, it would produce one value upon conversion. However, if the reference voltage were to drop suddenly during conversion of the sample, the ratio resulting from the conversion would produce a corresponding ratiometric decline—an incorrect result. Correspondingly, an error can also occur if the reference voltage were to increase during a conversion.

Figure 1:
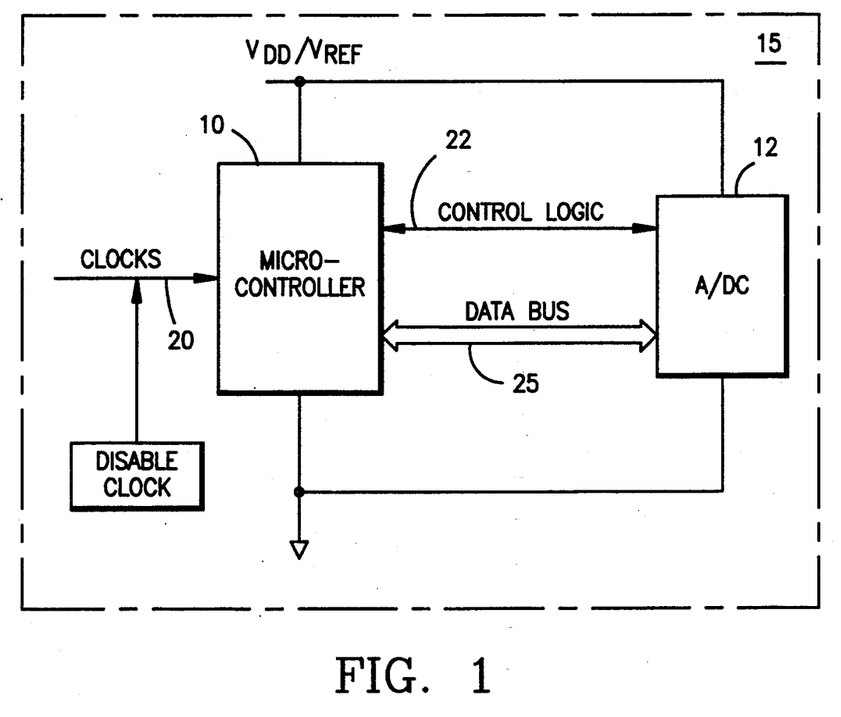
FIGS. 1 is a block diagram of a microcontroller device with ADC.

FIG. 1 is a simplified block diagram of a single CMOS semiconductor chip microcontroller device of the type utilized in conjunction with the present invention, but for purposes of explanation of the problems heretofore encountered it will be assumed for the moment that the invention is not incorporated therein. The device includes a microcontroller 10 and an A/D converter (ADC) 12 fabricated within a single silicon chip 15. The microcontroller and the ADC are powered by supply voltage $V_{DD}$ which is also $V_{REF}$, so it is shown as $V_{DD}/V_{REF}$. The microcontroller has one or more clock inputs 20, and control logic 22 and data bus 25 outputs and inputs to and from the ADC.

Figure 2:
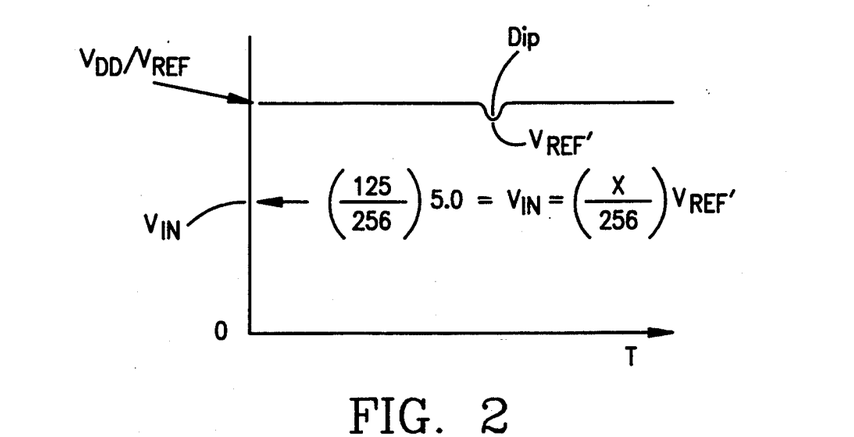
FIG. 2 is a voltage versus time plot for the device of FIG. 1 illustrating a noise perturbation affecting the conversion result, as explained in the Background section above.

FIG. 2 provides a graphic illustration of the noise problem and resulting inaccuracies in the A/D conversion process. The full-range voltage is $V_{DD}/V_{REF}$. With a voltage $V_{IN}$—shown on a voltage versus time plot—a comparison is made of that voltage against $V_{REF}$. The range is divided into many segments; for example, if an eight bit converter is being used, the range is divided into 256 segments. Suppose $V_{IN}$ ideally were precisely 125 relative to 256 states, i.e., 125/256, so that it happens to be at the 125th state or between the 125th and 126th states when sampling is performed. During the A/D conversion, $V_{REF}$ experiences a dip, as a perturbation of the power bus attributable to circuits suddenly becoming active and drawing power when clockings occur. When the reference voltage drops, $V_{IN}$ cannot be 125/256 based on 5 volts, but instead becomes X/256 based on the new value of $V_{REF}$ (shown as $V_{REF}'$). Despite the change in reference voltage, the circuit will seek to maintain $V_{IN}$ because that value has been captured internally by the sampling. Rather, the device is now working against the new and different reference level, resulting in an error because the ratio must change to accommodate the sample voltage.

A slightly different way of visualizing the problem is that an ADC associated with an 8-bit microcontroller divides the domain into 256 segments. If the power supply is operating at 5 volts, or, more conveniently for purposes of calculation, 5.12 volts which divides easily into 256, then one LSB (least significant bit) is 20 millivolts (mV). Noise equal to one-half of "1 LSB" value (10 mV here), however, may throw the input analog voltage into the next "bin", causing conversion error. If noise is present on the $V_{DD}$ supply bus—and the noise is typically considerably greater than 10 mV—a substantial portion of it may be coupled into the converter, and will cause error. In those circumstances, whatever noise couples into the A/D converter must be equal to or greater than 10 mV, which may occur often, to produce a gross error of one LSB.

When a 10-bit ADC is considered, the resolution provided is 1024 parts in 5 volts, so that the factor is no longer 10 mV per LSB, but 5 mV per LSB. And if a 12-bit ADC were used, the division results in 1.25 millivolts for each LSB. Thus, as higher bit devices are employed, the ability to tolerate noise and to provide conversion with acceptable error levels falls off sharply, and even very small perturbations of the power supply bus can become crucial.

In the past, clocking and proximity schemes typically have been used in an attempt to eliminate or at least reduce these problems. In the proximity scheme, the ADC is typically located on one chip physically displaced from the microcontroller located on another chip, such that digital clocking noise through the substrate may be better suppressed, if not eliminated. A variation is to attempt to work out satisfactory ground planes on the printed circuit boards. The clock scheme is a bit more involved. When the microcontroller is clocked during one edge of the input oscillator clock, e.g., the entire chip is clocked on the rising edge of the oscillator waveform—it is desirable to attempt the conversion during the falling edge of the clock. This would be at a point where the power supply is most likely to have stabilized, the quietest point of the process at which to perform the conversion.

Although such schemes are capable of providing some relief of noise problems with lower bit A/D devices for reasons mentioned above, they have not proved entirely successful for assuring high accuracy, resolution and efficiency, and are inadequate as higher bit devices are used.

Therefore, it is a principal object of the present invention to provide apparatus and methods which provide improved accuracy of A/D conversions associated with performance of microcontroller functions, by eliminating noise sources which adversely affect the accuracy.

SUMMARY OF THE INVENTION

According to the present invention, reliable correction is achieved in principal part by shutting down the CMOS microcontroller processor while the actual analog to digital conversion is underway, after the analog input voltage has been sampled. This does away with the noise perturbations which are otherwise normally encountered in the system. Most of the current drain occurring during the clock cycles is attributable to the microcontroller itself, and the ADC is provided with its own on-chip clock, so that upon shutdown of all the external system clocking in the microcontroller, the noise abates and the ADC is the only device that is operating. The conversion is then performed in a noise-free environment.

In essence, this shutoff is achieved in a way that although the microcontroller remains powered on, its system clock is deactivated during this shutdown period. In those circumstances, none of the gates or transistors associated with the microcontroller can switch state, and, while they remain static, there is no noise.

This amounts to a low power mode in which all of the clocking to the microcontroller is shut off. The ADC runs autonomously since it has its own internal clock and is powered up. Following the conversion, the ADC can shut itself down or wake up the microcontroller. When the microcontroller is awakened its clocks are restarted and its operation is resumed.

The mode in which the microcontroller becomes inactive as a consequence of deactivation of its clocks is referred to variously as a power down mode, a sleep mode, or a halt mode. In any event, the power is not actually removed, but the clock is simply stopped from toggling at the microcontroller input, so that it is held either high or low. As the CMOS microcontroller languishes in this static mode—with no switching or anything else taking place—it consumes no current. In a CMOS device, current is consumed only during switching, because only then are nodes being charged or discharged. In the "sleep" mode, then, although power remains applied to the microcontroller it draws no current, as its clock is held inactive by disabling the appropriate oscillators.

The invention is applicable to microcontrollers with A/D conversion regardless of the number of bits employed by the microcontroller or the converter in operation. Hence, references in the description of the present invention to 8-bit or other specific bit ADCs or microcontrollers are intended by way of example only, and are not intended to be a limitation on the scope or capability of the invention. The invention is also applicable to microprocessors, digital signal processors, and chips with intelligent control logic, with associated ADC.

Accordingly, it is another object of the present invention to provide apparatus and methods by which the accuracy of A/D conversions is improved through the elimination of digital switching activities of an otherwise associated device or devices while the conversions are actually being performed.

BRIEF DESCRIPTION OF THE DRAWINGS

The above and still further objects, features, and attendant advantages of the present invention will become apparent from a consideration of the following detailed description of a presently preferred embodiment, taken in conjunction with the accompanying drawings, in which.

DESCRIPTION OF PRESENTLY PREFERRED EMBODIMENT AND METHOD

In the preferred embodiment of the invention, the user may instruct the microcontroller to sleep after sampling of the analog input signal has been performed and an A/D conversion is commenced. The ADC ignores the sleep instruction provided that the conversion is in progress when the instruction is received, and provided also that the ADC is operating from its own internal clock and not the microcontroller system clock. Upon completion of the conversion, the ADC signals the microcontroller by dispatching an interrupt to awaken the chip (the device). Alternatively, the interrupt may be ignored by the microcontroller, and after a brief delay if the ADC senses that the sleep line remains active, the ADC operates to turn itself off. It remains capable, however, of detecting removal of the sleep command by being gated by a control bit, to turn itself back on so that sampling and subsequent conversions may be performed.

The microcontroller, ADC and related circuitry are preferably fabricated in a single silicon chip using conventional low power CMOS process technology. The arrangement shown in the block diagram of FIG. 1, described above, is applicable to the device of the present invention, except that the ADC has its own clock input, from an on-chip RC oscillator, when the user elects not to have the ADC clocked from the microcontroller system clock, as will be explained presently with reference to FIG. 3.

The ADC module has multiple analog input channels, four in the exemplary embodiment, multiplexed into a single sample and hold circuit and ADC. Reference voltage $V_{REF}$ may be derived internally from $V_{DD}$ or obtained externally from a pin of the device. The ADC is preferably generally of the conventional successive approximation (also known as binary search) type, except as will be described with regard to the capability to turn itself off and on, and in the presently preferred embodiment produces an 8 bit result in a selected register.

A conversion is initiated by setting a control bit. Prior to conversion the appropriate channel must be selected and sufficient time allowed for the sampling to be completed. The actual conversion time is a function of the oscillator cycle, and in the present embodiment is 20 microseconds ($\mu$s). At the end of conversion, the control bit is cleared and an interrupt is activated. The overall accuracy of the conversion (zero error, full scale error, integral error and quantization error) is less than $\pm 1$ LSB for $V_{DD}=5$ V$\pm 10\%$ and $V_{REF}=V_{DD}$. For reasons pointed out earlier herein, $V_{DD}$ is typically conveniently set at 5.12 V. The resolution and accuracy is less when $V_{REF}$ is less than $V_{DD}$ or for $V_{DD}$ less than 5.12 V.

Figure 3:
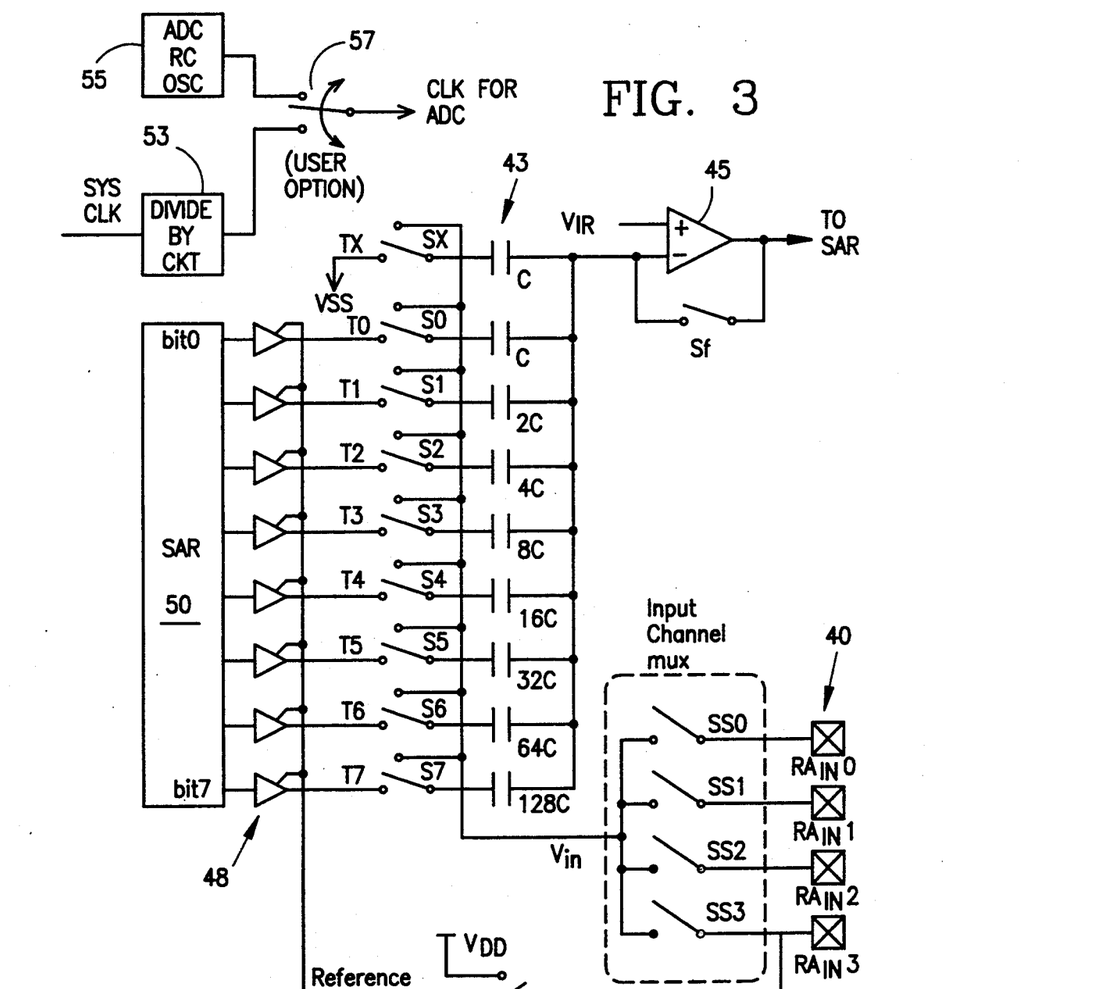
FIG. 3 a circuit diagram of a successive approximation ADC employing the concepts of the present invention.

Referring to FIG. 3, a successive approximation type ADC operates by sampling the selected channel through one of a plurality of sampling gates SS0–SS3. Sampling continues as long as the control bit is "0". The sampling time required depends on the source impedance of the particular analog input 40. During sampling, switch Sf is closed and switches Sx and S0–S7 connect all of the capacitors 43 to the analog input. The total effective capacitance is 256C, where C is approximately 0.2 pF in the exemplary embodiment. The voltage across the capacitors at the end of sampling is ($V_{in}-V_{IR}$) since the negative input (-ve) of the comparator 45 is maintained at $V_{IR}$ as a consequence of feedback. $V_{in}$ is the sampled voltage, and $V_{IR}$ is an internal reference voltage approximately equal to $V_{DD}/2$ ($V_{REF}/2$). The large effective capacitance acts as the holding capacitance during the conversion.

Conversion begins as soon as the control bit is set. The sampling gate (SS0–SS3) is shut off, switch Sf is opened, and the capacitors 43 maintain their charge. Conventional successive approximation steps are then carried out. Terminals T0 through T7 are driven by buffers 48 powered by $V_{REF}$ (reference voltage), and may be at either $V_{SS}$ (i.e., ground, or true zero voltage) or $V_{REF}$ potential under the control of the bits of successive approximation register (SAR) 50.

In carrying out the successive approximation process, initially terminals T0 through T6 are driven (by the buffers) to $V_{SS}$ and terminal T7 is driven to $V_{REF}$. Switch Sx is always connected to $V_{SS}$ during these steps. Physically, switches S0 through S7 are connected to respective outputs of buffers 48 while the bits in SAR 50 are set and reset to connect capacitors 43 to $V_{SS}$ or $V_{REF}$. Driving terminal T7 to $V_{REF}$ essentially subtracts one-half $V_{REF}$ from the potential at the comparator 45 input. The potential at the negative input to the comparator is ($V_{REF}/2+V_{IR}-V_{in}$) at the first step, T7=high or "1", T6 through T0=low or "0". If the comparator output is low, indicating that $V_{in}$ is less than 0.5 $V_{REF}$, the most significant bit (MSB) of SAR 50 is reset; otherwise, it is kept at "1". Next, S6 connects to $V_{REF}$ from $V_{SS}$, and so forth until all bits are resolved.

At the end of the conversion, the voltage on the inverting input of the comparator is ($V_{IR}$+residual voltage). The actual value of $V_{IR}$ is not critical except that it must be in the range of ($V_{REF}/2$)$\pm 0.3$ V. If $V_{IR}$ is outside this range, then during the successive approximation process the voltage at the -ve input of the comparator may go beyond $V_{DD}$ or $V_{SS}$ by 0.6 V (in the exemplary embodiment), because of additional subtraction attributable to charge, which would cause parasitic diode junctions to turn on. An auxiliary comparator may be used to determine whether or not the voltage on the hold capacitor is greater or less than $V_{REF}/2$. Based on this determination, either T7 is closed before T6–T0 or vice versa, which ensures that the voltage at the -ve input to comparator 45 will not go beyond the $V_{SS}$ to $V_{DD}$ range. The offset voltage of the comparator is cancelled out during the successive approximation process. As noted above, this type of conversion process is completely conventional in and of itself, and need not be described further.

It is important that the ADC have available its own clock source, that is, independent of the microcontroller system clock. As shown in FIG. 3, the ADC has an input derived from the system clock via a divider circuit 53, and a separate RC oscillator clock 55, with selection of one or the other available via switch 57 which is at the user's option.

Figure 4:
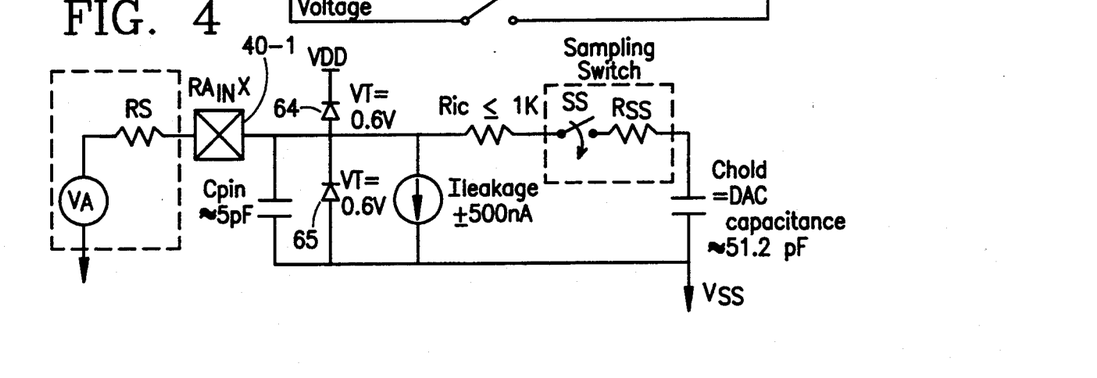
FIG. 4 is a circuit diagram of an analog input model for the successive approximation ADC of FIG. 3.

FIG. 4 illustrates a simplified circuit diagram of an analog input model for the ADC of FIG. 3. Component and parameter values shown in the Figure are by way of example for this embodiment. $C_{pin}$ is input capacitance $V_T$ is threshold voltage, $I_{Leakage}$ is leakage current at the pin attributable to various junctions, $R_{ic}$ is interconnect resistance, SS is the sampling switch, $R_{SS}$ is on resistance of the sampling switch, $C_{hold}$ is sample/hold capacitance (from DAC), $R_S$ is the source impedance of the analog input, and $V_A$ is the analog input voltage. The sample and hold circuit consists of a sampling switch (SS) and a holding (S/H) capacitor whose value, in the exemplary embodiment, is typically 51.2 pF.

Since the analog pins (such as 40-1, the only one shown here) are connected to digital output, they would have reverse biased diodes 64 to $V_{DD}$ and 65 to $V_{SS}$. The analog input must therefore be between $V_{SS}$ and $V_{DD}$. If the input voltage deviates from this range by more than 0.6 V (in the exemplary embodiment) in either direction, one of the diodes will be forward biased and a latch-up may occur.

Each step of the approximation performed by the ADC of FIG. 3 takes one A/D clock cycle (tad, which is the conversion time for each bit), derived from either an external oscillator clock input or from an on-chip RC oscillator. The conversion time for each bit is the minimum time required by the comparator to resolve one bit of the comparison, and one clock cycle should be equal to or greater than that minimum time (which in the exemplary embodiment is 2 μs, i.e., tad≧2 μs). The chip clocks and the comparator samples on the rising edge of the clock cycle, while the conversion bit result (the comparator output) is latched on the falling edge.

Figure 5:
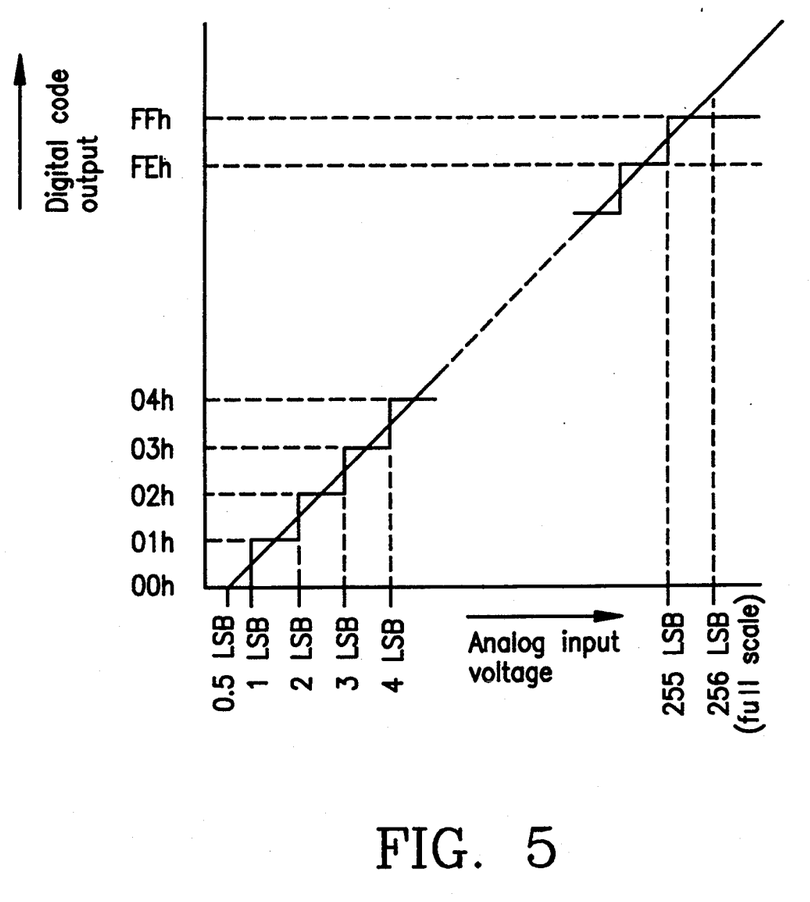
FIG. 5 is a graph of an ideal transfer function of digital output versus analog input voltage for the successive approximation converter of FIG. 3.

The ideal transfer function of the ADC is illustrated in FIG. 5, in which the first transition occurs when the analog input voltage ($V_A$) is 1 LSB (or full scale/256).

According to the present invention, the ADC is provided with its own clock, from an on-chip RC oscillator, so that when an actual A/D conversion is commenced the microcontroller may optionally (by an instruction from the user) be placed in the low power "sleep" mode in which all of the system clocking and switching functions of the microcontroller are abated, without aborting the conversion. Although the conversion takes place with the microcontroller in "sleep" state, the sampling phase can only be performed with both the microcontroller and the ADC in an active state (non-sleep). The shutdown of the microcontroller switching and consequent avoidance of its related sudden current drains and disturbances on the power supply bus during the actual conversion process eliminates the principal source of the digital switching noise that otherwise tends to reduce the accuracy of the conversion.

The disabling of all clocking to the microcontroller constitutes only a low power mode, not a complete shutdown of all power to the microcontroller. In that mode, the clock ceases toggling the microcontroller input, and it is held high or low (whichever is of no consequence). Since the microcontroller (as well as the remainder of the single chip device) was fabricated using CMOS semiconductor process technology, it consumes current only during switching operations (e.g., from "1" to "0" or vice versa) in which nodes are being charged or discharged. It is only during these current drain transitions that switching noise occurs, and thus, the A/D conversion accuracy is optimized while the microcontroller is halted, even while the converter is operating at high clock rates.

The control logic employed in the device allows the user to instruct the microcontroller to enter this low power sleep mode for noise-free A/D conversion. In that sense, the microcontroller is selectively (optionally) placed in the low power mode. Conversion is commenced just before microcontroller sleep, to preclude the ADC from being put in sleep also. The control logic is further implemented to cause the ADC to notify the microcontroller (e.g., through an interrupt) when the conversion process is completed, thereby causing the microcontroller to respond (in one scenario) by restarting its clocks (oscillators) and resuming operation. Alternatively, the interrupt may be ignored.

When the microcontroller is placed in sleep, conversion will continue only if both (1) the conversion was started (actual conversion is running, not merely sampling) before sleep has executed, and (2) the conversion is being executed with the ADC using its internal RC clock. If the "sleep" instruction were given to the microcontroller while an A/D conversion is in progress using the external (to the chip) microcontroller system clock, in contrast to the ADC'c own RC oscillator clock, the conversion would be aborted. In that event, all current consuming circuits are shut off, the control bit is cleared, and conversion would need to be re-initialized after wake-up, with a resampling of the analog input voltage.

To reduce operating current when not needed, the control logic allows the ADC to cause its biasing circuits that consume DC current, i.e., for amplifier and comparator functions, to be shut off through a control bit when not in use. These circuits must be on for sampling and conversion. However, since conversion activities are not performed continuously, but typically only at intervals when some parameter determinative of whether a control function of the microcontroller should be initiated is to be monitored, the energy saving can be quite significant. This is an invention which is the subject of a separate related copending application, referred to initially herein.

Because the ADC is capable of powering itself down (shutting itself off), and powering up (turning back on) when sampling and a conversion are to be performed— which may be once every second, once every ten milliseconds, or some other interval—the device is well adapted to battery-operated applications, where the conservation of power is a key factor in the effective lifetime of the device. An example of such an application is in the common battery-operated smoke detector. It is, of course, essential to maintain sufficient power to allow the device to perform its function. The alarm is effective only as long as the battery is not depleted, and all too often the user neglects to replace an exhausted battery or even to verify that it is in an active condition by checking that it is flashing periodically. If the device is essentially asleep—not consuming power—except when it is periodically awakened to monitor the temperature or some other sensor, and then an A/D conversion is required, which may result in generation of an alarm or a return to sleep, the useful lifetime of the device may be extended by a considerable period.

As discussed above, the ADC will ignore a sleep instruction only if the conversion is in progress and it is operating from its internal clock. After the conversion is completed, the ADC sends an interrupt to the microcontroller either to be acted on by waking the chip or to be ignored. The ADC is adapted to "wait" two tad cycles before acknowledging a "sleep" command, and, hence, the microcontroller will have had plenty of time to delay the command. If at the end of the "wait" period, the sleep line is still active, the ADC will "power-down" at that time. The same circuitry that "reads" the sleep control line also is gated with a control bit which can turn the ADC on and off. It should be mentioned that a timer circuit may be activated during sleep, if desired, to time the length of the sleep period. Although this may be accomplished with very little current consumption, it is not sufficiently low for the circuit to be considered "off".

Figure 6:
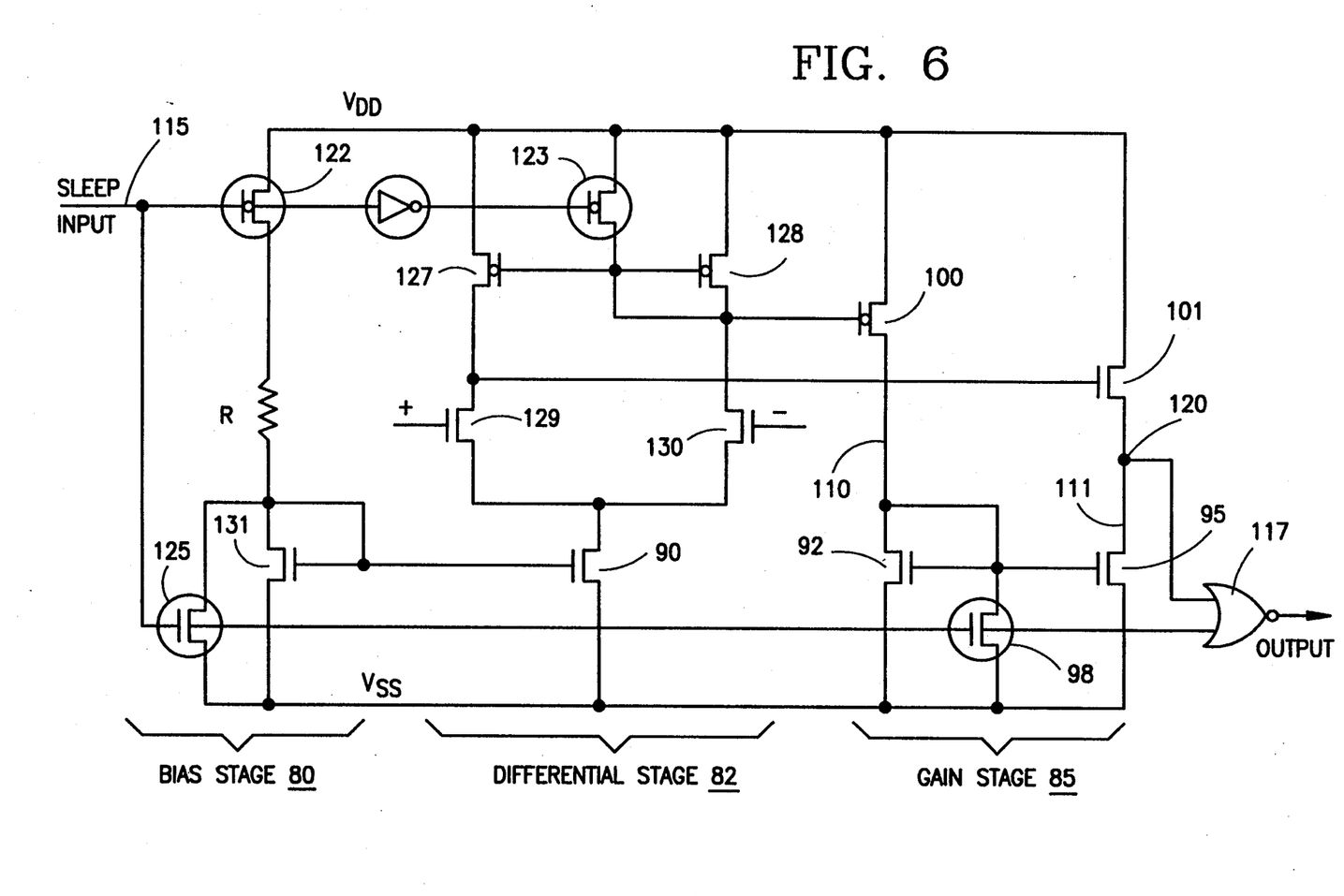
FIG. 6 is a simplified circuit diagram of a modified amplifier of the ADC by which the ADC is adapted to power itself down.

A simplified circuit diagram of a modified amplifier circuit of the ADC is presented in FIG. 6, to illustrate the principles by which the "power-down" is achieved. Comparator 45 (FIG. 3) acts as such an amplifier during sampling, performing its comparator function only during actual conversions. The amplifier circuit has three separate stages, a bias circuit 80, a differential stage 82, and a gain stage 85. It is desirable to supply a voltage that will bias the transistors of the various stages into their linear mode in which they act as an ideal current source. In that mode, the transistor draws a constant current which enhances the signal amplification.

Typically, the bias-circuit and other portions of the amplifier are continuously drawing power. When the bias circuit is shut off, the bias voltage on the transistor changes so that it is no longer in a linear mode. Instead, the active elements are in an off state, and various portions of the A/D converter may be shut off, including the differential stage. In the amplifier of FIG. 6, only transistor 90 is used as an ideal current source, and when it is turned off, no current will flow through the differential stage 82.

The gain stage 85 is shut off by pulling down the gates of transistors 92 and 95, employing transistor 98 for that purpose. When those devices are in an off state, no current flows through paths 110, 111 of the gain stage. The upper portion of the gain stage is further disabled by pulling p-channel transistor 100 high with a high voltage on the gate, so it does not consume any power either. In the bias stage 80 the disabling is achieved by pulling down the gate of transistor 131 with transistor 125 on. In the differential stage 82, the gates of transistors 127 and 128 are pulled up to $V_{DD}$ with transistor 123 on.

The sleep input to the amplifier is at line 115, and the sleep state of the ADC is driven or not by the signal on that line. Taking that input line high or low through control logic directly affects the states of transistors 122 and 125 and consequently of transistors 123 and 98, respectively. These, in turn, control the states of the usual transistors in the amplifier stages. The amplifier output is taken from gate 117, because if it were taken from floating node 120 the components following the output would draw current. In the transistor "off" states, for a p-channel transistor the relatively negative voltage on the gate of the transistor is less than $V_P$, where $V_P$ is the threshold of the device; and for an n-channel transistor the relatively positive voltage on the gate of the transistor is less than $V_N$, where $V_N$ is the threshold of the device.

In normal operation of the amplifier, the following conditions are present. The sleep (off) input line 115 is at $V_{SS}$ (ground). Transistor 122 is on, the voltage at the gate of transistor 123 is $V_{DD}$ and that transistor is off. Transistors 125 and 98 are also off. Transistor 131 in bias stage 80 is in the linear mode, as are transistors 127, 128, 129, 130 and 90 in differential stage 82, and transistors 92, 95, 100 and 101 in gain stage 85. In the off state of the amplifier, the conditions existing are as follows. The off input line 115 is at $V_{DD}$, the gate of transistor 123 is at $V_{SS}$ and that transistor is on. Transistor 131 in the bias stage is off, as are transistors 127, 128 and 90 in the differential stage and transistors 92, 95 and 100 in the gain stage.

Accordingly, by simply adding the components shown as circled to the overall amplifier circuit of FIG. 6, power is selectively shut off completely according to an input command, with the appropriate transistors of the various stages driven to the off-state, so that none of the stages are drawing current. In this way, the A/D converter is able to power itself down without assistance from the associated microcontroller.

Further, the power down is achieved with an extremely low current, typically about one microampere ($\mu A$), and no more than about 10 $\mu A$ for the microcontroller plus the ADC. This lower current drain is achieved primarily by process management to assure minimal leakage current during fabrication, and to identify and remove inadvertent leakage paths which arose as a result of design and fabrication of the system.

Resistor R in the amplifier circuit of FIG. 6 is implemented in the normal CMOS processing as an inactive element which when contacted at both ends, acts as a discrete resistance component. Alternatively, the resistor may be implemented as a MOSFET device.

Although a presently preferred embodiment of the invention has been illustrated and described in the foregoing specification, it will be apparent to those skilled in the relevant field that variations and modifications may readily be implemented without departing from the true spirit and scope of the invention. Accordingly, it is intended that the invention should be limited only by the appended claims and the pertinent rules of applicable law.

What is claimed is:

1. A microcontroller device for performing control functions on a system to be controlled, comprising:
   control means for performing the control functions,
   analog to digital conversion means for performing conversions to assess a condition affecting the controlled system for use by the control means in determining whether a control function is to be performed, and
   error reduction means for reducing conversion error attributable to noise perturbations from the control means by deactivating the control means while the analog to digital conversion means is performing conversions.

2. The device of claim 1, wherein:
   the error reduction means deactivates only switching functions of the control means.

3. The device of claim 1, wherein:
   the microcontroller device comprises a CMOS integrated circuit fabricated on a single semiconductor chip.

4. The device of claim 1, further including:

independent asynchronous clock means for separately providing clock signals to said control means and said conversion means to control the switching functions thereof.

5. The device of claim 4, wherein:

the error reduction means deactivates the clock means to eliminate the clock signals to said control means only, while continuing to provide clock signals to said analog to digital conversion means, while a conversion is being performed by said analog to digital conversion means.

6. In a CMOS microcontroller adapted to perform analog to digital conversions of an analog signal representative of a variable parameter indicative of whether or not a control function is to be exercised by the microcontroller, and including a source of power, the improvement comprising:

an analog to digital converter for perforating the conversions, and control logic means responsive to the analog to digital converter performing a conversion, for powering down the microcontroller for a period required to perform the conversion to reduce conversion error attributable to performance of switching functions by the microcontroller.

7. The improvement of claim 6, wherein:

each of the microcontroller and the converter include means for performing power consuming switching functions, and the control logic means powers down the microcontroller by eliminating only its switching functions.

8. The improvement of claim 7, further including:

separate clock generating oscillators for the microcontroller and the analog to digital converter.

9. The improvement of claim 8, wherein:

the control logic means powers down the microcontroller by deactivating its clock generating oscillator only.

10. A method of operating a microcontroller device to perform control functions on a system to be controlled, comprising the device-implemented steps of:

performing analog to digital conversions to assess a condition affecting the controlled system to determine whether a control function is to be performed on the controlled system by the microcontroller device, and deactivating a portion of the microcontroller device while performing each analog to digital conversion, to reduce conversion error attributable to noise which would otherwise be generated by power consuming switching functions of said portion of the microcontroller device.

11. The method of claim 10, including:

performing the deactivation of said portion of the microcontroller device by deactivating only the switching functions of said portion.

12. The method of claim 10, wherein:

the microcontroller device is fabricated in CMOS semiconductor process technology.

13. The method of claim 11, further including:

supplying separate clock signals to said portion of the microcontroller device to be deactivated and to another portion of the microcontroller device for performing the analog to digital conversions, to separately control switching functions of each said portion.

14. The method of claim 13, including:

deactivating the first-mentioned portion of the microcontroller by eliminating only the clock signals for that portion while continuing to supply clock signals for said another potion performing the analog to digital conversions.

15. A method of operating a CMOS device adapted to perform analog to digital conversions and having intelligent control logic, comprising the device-implemented steps of:

performing analog to digital conversions of a predetermined analog input signal as part of the device operation, and during each analog to digital conversion, deactivating designated portions of the device engaged in switching functions other than for performing an analog to digital conversion, to reduce conversion error otherwise attributable to switching functions performed by the portions designated for deactivation.

16. The method of claim 15, including:

deactivating said designated portions of the device by disabling their switching functions.

17. The method of claim 15, including:

providing clock signals for timing and switching functions of said device, and deactivating said designated portions of said device by disabling clock signals to said portions, while maintaining clock signals for the analog to digital conversion.

* * * * *

UNITED STATES PATENT AND TRADEMARK OFFICE
CERTIFICATE OF CORRECTION

PATENT NO. : 5,422,807
DATED : June 6, 1995
INVENTOR(S) : Mitra, et al.

It is certified that error appears in the above-indentified patent and that said Letters Patent is hereby corrected as shown below:

Column 5, line 9, insert the word -- is -- after the phrase "FIG. 3"

Column 7, line 13, insert a comma (-- , --) after the word "capacitance"

Column 11, line 19, delete the word "perforating" and insert therefor the word -- performing --

Signed and Sealed this

Twenty-ninth Day of August, 1995

Attest:

BRUCE LEHMAN

Attesting Officer     Commissioner of Patents and Trademarks